(12) United States Patent
Elsherbini et al.

(10) Patent No.: US 10,943,851 B1
(45) Date of Patent: Mar. 9, 2021

(54) RECONSTITUTED WAFER ASSEMBLY

(71) Applicant: Intel Corporation, Santa Clara, CA (US)

(72) Inventors: Adel Elsherbini, Tempe, AZ (US); Shawna Liff, Scottsdale, AZ (US); Henning Braunisch, Phoenix, AZ (US); Johanna Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/706,383

(22) Filed: Dec. 6, 2019

(51) Int. Cl.
| | |
|---|---|
| *H01L 23/473* | (2006.01) |
| *G02B 6/122* | (2006.01) |
| *G02B 6/13* | (2006.01) |
| *H01L 23/538* | (2006.01) |
| *H01L 23/31* | (2006.01) |
| *H01L 23/00* | (2006.01) |
| *H01L 21/56* | (2006.01) |
| *H01L 25/16* | (2006.01) |
| *H01L 25/00* | (2006.01) |
| *H01L 21/48* | (2006.01) |
| *H05K 1/02* | (2006.01) |

(52) U.S. Cl.
CPC .......... *H01L 23/473* (2013.01); *G02B 6/122* (2013.01); *G02B 6/13* (2013.01); *H01L 21/481* (2013.01); *H01L 21/56* (2013.01); *H01L 23/3121* (2013.01); *H01L 23/5381* (2013.01); *H01L 23/5386* (2013.01); *H01L 24/19* (2013.01); *H01L 24/24* (2013.01); *H01L 25/16* (2013.01); *H01L 25/50* (2013.01); *H05K 1/0272* (2013.01); *H05K 1/0274* (2013.01); *H01L 2224/24137* (2013.01); *H05K 2201/064* (2013.01)

(58) Field of Classification Search
None
See application file for complete search history.

(56) References Cited

U.S. PATENT DOCUMENTS

| | | | | |
|---|---|---|---|---|
| 5,929,518 A | * | 7/1999 | Schlaiss | G02B 6/4214 |
| | | | | 257/415 |
| 7,298,623 B1 | * | 11/2007 | Kuczynski | H01L 23/473 |
| | | | | 174/15.1 |
| 2003/0197266 A1 | * | 10/2003 | Simon | H01L 31/024 |
| | | | | 257/714 |
| 2007/0254411 A1 | * | 11/2007 | Uhland | H01L 23/5389 |
| | | | | 438/127 |
| 2010/0215314 A1 | * | 8/2010 | Lau | G02B 6/43 |
| | | | | 385/14 |

(Continued)

FOREIGN PATENT DOCUMENTS

WO  WO 2018/178745 A1 * 10/2018

*Primary Examiner* — Michael Stahl
(74) *Attorney, Agent, or Firm* — Green, Howard & Mughal LLP.

(57) ABSTRACT

An integrated circuit device assembly may be formed comprising a reconstituted wafer attached to a base substrate, wherein the base substrate provides thermal management and optical signal routes. In one embodiment, the base substrate may include a plurality of electrical interconnects for electrically coupling integrated circuit devices in the reconstituted wafer. In another embodiment, a plurality of electrical interconnects for electrically coupling integrated circuit devices in the reconstituted wafer may be formed in the reconstituted wafer itself.

22 Claims, 11 Drawing Sheets

(56) References Cited

U.S. PATENT DOCUMENTS

| | | | | |
|---|---|---|---|---|
| 2012/0020020 A1* | 1/2012 | Julien | ............... | H01L 23/473 |
| | | | | 361/689 |
| 2012/0162947 A1* | 6/2012 | O'Donnell | ............ | H01L 28/82 |
| | | | | 361/783 |
| 2013/0146253 A1* | 6/2013 | Daly | ............... | H01S 5/02423 |
| | | | | 165/80.4 |
| 2014/0355983 A1* | 12/2014 | Gusat | ................ | H04B 10/25 |
| | | | | 398/45 |

* cited by examiner

RECONSTITUTED WAFER ASSEMBLY

TECHNICAL FIELD

Embodiments of the present description generally relate to the fabrication of integrated circuit device assemblies, and, more particularly, to fabricating an integrated device assembly comprising a reconstituted wafer attached to a base substrate, wherein the base substrate provides thermal management and optical signal routes.

BACKGROUND

The integrated circuit industry is continually striving to produce ever faster, smaller, and thinner integrated circuit packages for use in various electronic products, including, but not limited to, computer servers and portable products, such as portable computers, electronic tablets, cellular phones, digital cameras, and the like.

As these goals are achieved, the integrated circuit devices become smaller. However, computing demands have been increasing considerably faster than scaling (e.g. Moore's law) can achieve. For example, machine intelligence systems are requiring core counts in the thousands, "near compute" memory of greater than 10 gigabytes, connectivity bandwidth of greater than one terabyte per second between multiple nodes, low latency, thermal control, and good manufacturability, as will be understood to those skilled in the art. Attempts have been made to meet these requirements through monolithic integration and/or wafer stacking. Monolithic integration may include forming a wafer scale supercomputer, which employs several levels of redundancy, such that a large area of monolithically integrated silicon (e.g. a wafer) is functional. However, such monolithic integration may have drawbacks, including lower performance due to parasitic capacitance, greater design complexity, and significant area penalty to support the integration, as will be understood to those skilled in the art. Wafer stacking, as known in the art, may be used in conjunction with monolithic integration to assist with heterogeneity, such as between memory and computing devices, but does not address the other issues with regard to monolithic integration, as previously mentioned. Assembly-based approaches may be used to form a reconstituted wafer for the monolithic integration, wherein a plurality of "known good dice", i.e. integrated circuit devices, are attached together, such as with a dielectric material, to form a wafer-like substrate. The integrated circuit devices may be electrically coupled by "die-stitching" structures, such as embedded multi-die interconnect bridges (EMIBs), passive interposers, advanced high-density organic packages, and the like. Although reconstituted wafers can address some of the previously mentioned issues with regard to monolithic integration, additional innovations are needed to overcome existing challenges with regard to latency, bandwidth density, and thermal control.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
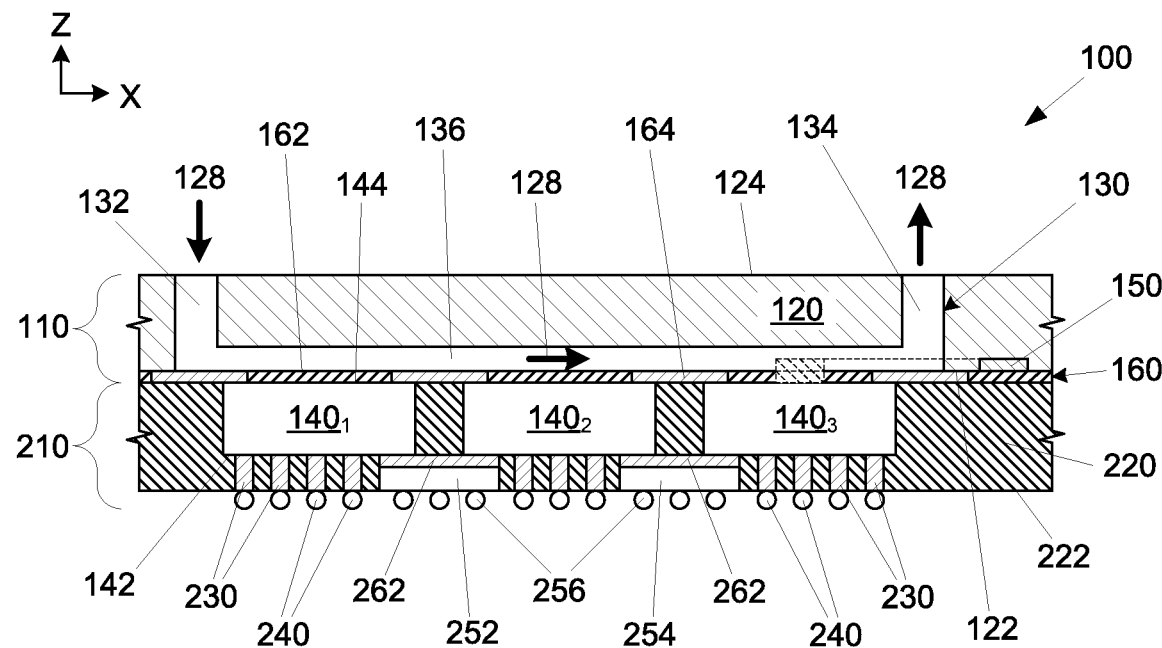
FIG. 1 is a side cross-sectional view of an integrated circuit device assembly having a base substrate, providing at least one fluid cooling network and at least one optical waveguide network, attached to a reconstituted substrate having a plurality of integrated circuit devices, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package or silicon substrate. For purposes of this disclosure, dielectric material may be incorporated into an integrated circuit package as layers of laminate film or as a resin molded over integrated circuit dice mounted on the substrate or as spin-on dielectric, such as spin-on glass or as a dielectric deposited through physical and/or chemical deposition technique, such as chemical vapor deposition or silicon oxides or nitrides.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description include an integrated circuit device assembly comprising a reconstituted wafer attached to a base substrate, wherein the base substrate provides thermal management and optical signal routes. In one embodiment, the base substrate may include a plurality of electrical interconnects for electrically coupling integrated circuit devices in the reconstituted wafer. In another embodiment, a plurality of electrical interconnects for electrically coupling integrated circuit devices in the reconstituted wafer may be formed in the reconstituted wafer itself.

As shown in FIG. 1, an integrated circuit device assembly 100 may comprise a base substrate 110 formed from a first substrate 120 having a first surface 122 and an opposing second surface 124. The base substrate 110 may be have a fluid cooling network 130 formed therein. The fluid cooling network 130 may be particularly important due to high power that may be used and/or the potential for thermal hotspots, as will be understood to those skilled in the art. The fluid cooling network 130 may comprise at least one inlet chamber 132, at least one outlet chamber 134, and at least one fluid channel 136 extending between the at least one inlet chamber 132 and the at least one outlet chamber 134. The at least one fluid channel 136 may extend into the first substrate 120 from a first surface 122 thereof. The at least one inlet chamber 132 and the at least one outlet chamber 134 may each be formed to extend from the second surface 124 to the at least one fluid channel 136. As further shown in FIG. 1, an optical waveguide network 150 may then be formed extending into the first substrate 120 from the first surface 122 thereof, as will be discussed. The base substrate 110 may further include an electrical interconnect layer 160 formed on the first surface 122 of the first substrate 120.

A reconstituted wafer 210 may be formed on or coupled to the base substrate 110. The reconstituted wafer 210 may comprise a plurality of integrated circuit devices $140_1$-$140_3$ encapsulated in a dielectric material 220, wherein each integrated circuit device $140_1$-$140_3$ has a first surface 142 and an opposing second surface 144. The second surface 144 of each of the integrated circuit devices $140_1$-$140_3$ of the reconstituted wafer 210 may be electrically attached to electrical interconnects 164 within the electrical interconnect layer 160 of the base substrate 110. At least one of the integrated circuit devices, specifically illustrated as integrated circuit device $140_3$, may be an optical router, which is coupled to the optical waveguide network 150 of the base substrate 110.

As shown in FIG. 1, a working fluid (indicated with arrow 128) may be directed into the at least one inlet chamber 132, wherein it flows through the at least one fluid channel 136 to the at least one outlet chamber 134. The close proximity of the at least one fluid channel 136 to the plurality of integrated circuit devices $140_1$-$140_3$ results in heat being removed therefrom by the working fluid 128. The working fluid 128 may be any appropriate thermal conduction fluid, including but not limited to water, glycols, brines, and the like. In another embodiment, the working fluid 128 may be a two-phase cooling system, wherein the working fluid 128 is liquid over part of the fluid channel 136 and a gas over another part of the fluid channel 136. In one embodiment, the working fluid 128 may be a cooling refrigerant with a boiling point lower than water, which may allow for long fluid channels 136 without excessively high pressure drop across the fluids channel 136 and/or without requiring a higher number of inlet chambers 132 and outlet chambers 134.

The reconstituted wafer 210 may include a plurality of conductive vias 230 extending from the first surface 142 of each of the integrated circuit devices $140_1$-$140_3$ to a first surface 222 of the dielectric material 220. An external attachment 240, such as solder balls, pin grid array compression pins, or compliant interconnects, may be disposed on each of the conductive vias 230 for the attachment of the integrated circuit device assembly 100 to external components (not shown), such as an interposer, a printed circuit board, a motherboard, or the like. The reconstituted wafer 210 may further include at least one chiplet between and electrically coupled to a pair of adjacent integrated circuit devices. For example, a first chiplet 252 may be shared with adjacent integrated circuit devices $140_1$ and $140_2$, and a second chiplet 254 may be shared with adjacent integrated circuit devices $140_2$ and $140_3$. The at least one chiplet, e.g. the first chiplet 252 and the second chiplet 254, may be active and/or passive devices, and may have external attachments 256, such as solder balls, for attachment to an external component (not shown).

As will be understood to those skilled in the art, the embodiments of the present description are essentially wafer-level supercomputers that can address issues with regard to latency and bandwidth density through the use of both optical and electrical signaling networks, and can address issues with regard to heat removal through the fabrication of the fluid cooling network in the base substrate.

Figure 2:
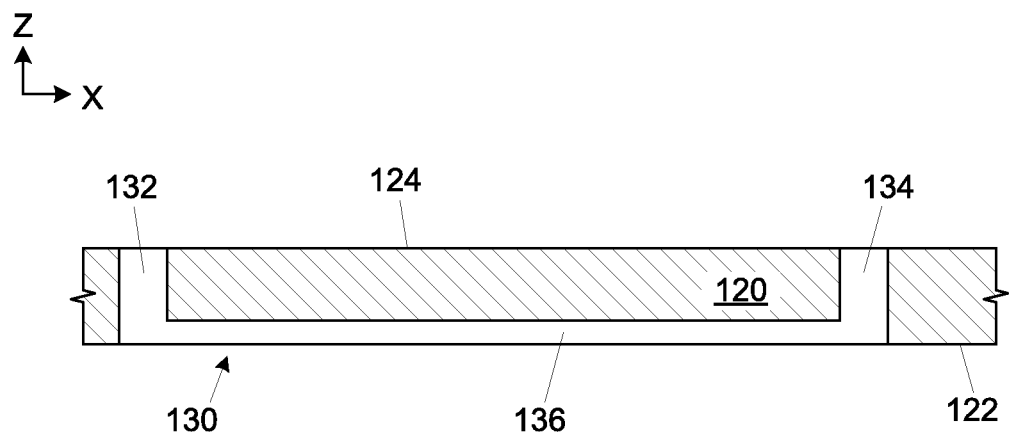
FIGS. 2 and 3 are a side cross-sectional view and a top plan view, respectively, of the fluid cooling network formed in the base substrate, according to one embodiment of the present description.
Figure 3:
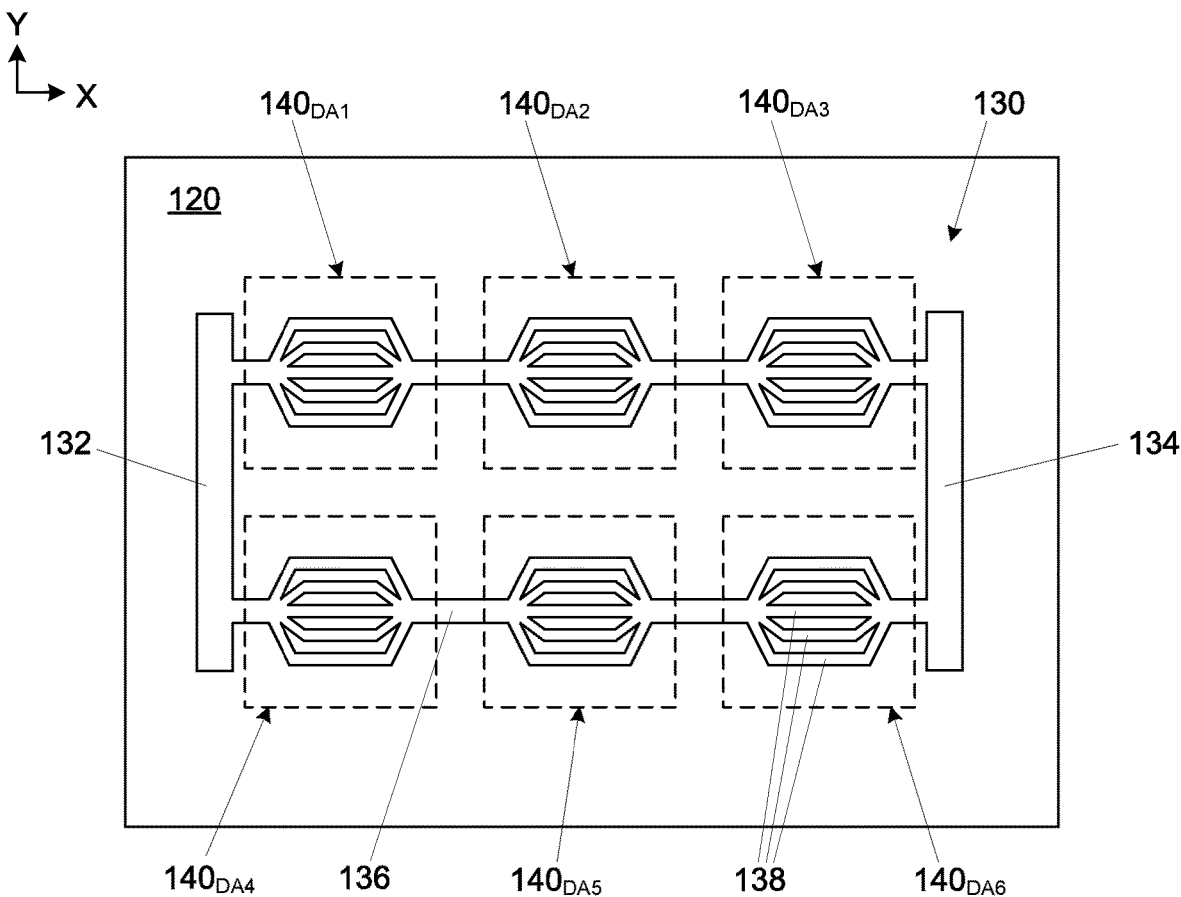

FIGS. 2-12 illustrate a method of fabricating the integrated circuit device 100 of FIG. 1. As shown in FIGS. 2 and 3, the base substrate 110 may be formed by forming or providing a first substrate 120, such as silicon, and forming the fluid cooling network 130 therein. As previously discussed, and as shown in FIG. 2, the fluid cooling network 130 may comprise at least one inlet chamber 132, at least one outlet chamber 134, and at least one fluid channel 136 extending between the at least one inlet chamber 132 and the at least one outlet chamber 134. The at least one fluid channel 136 may extend into the first substrate 120 from a first surface 122 thereof. The at least one inlet chamber 132 and the at least one outlet chamber 134 may each be formed to extend from the second surface 124 to the at least one fluid channel 136. The at least one fluid channel 136 may have any appropriate shape or configuration, as required for the effective removal of heat from the integrated circuit devices (see elements $140_1$-$140_3$ of FIG. 1). In one embodiment shown in FIG. 2, the at least one fluid channel 136 may fan-out into a plurality of substantially parallel sub-channels 138 within at least one device attachment area $140_{DA1}$-$140_{DA6}$ for each integrated circuit device (shown in FIG. 1 as integrated circuit devices $140_1$-$140_3$) and recombine into a single channel outside of the device attachment areas $140_{DA1}$-$140_{DA6}$. It is understood that the sub-channels 138 can be of different widths and length (not shown), e.g. wider over certain locations within at least one device attachment area $140_{DA1}$-$140_{DA6}$ for each integrated circuit device (shown in FIG. 1 as integrated circuit devices $140_1$-$140_3$) to allow higher mass flow rate (and thus higher heat transfer)

over those integrated circuit devices (shown in FIG. 1 as integrated circuit devices $140_1$-$140_3$). Additionally, longer sub-channels 138 may also be designed to be wider than the shorter sub-channels 138 such that all the sub-channels 138 have comparable mass flow rate and support uniform cooling capability over the device attachment areas $140_{DA1}$-$140_{DA6}$. It is understood that more complex structures for the fluid cooling network 130 may be formed through stacking multiple substrates, e.g. to provide more gradual steps in the Z-direction from the at least one inlet chamber 132 into at least one fluid channel 136 or to support multi-layer fluid channel 136 routing, which may simplify the design if the different integrated circuit devices (shown in FIG. 1 as integrated circuit devices $140_1$-$140_3$) have different cooling requirements (e.g. certain optical components may require operation in a tight temperature window compared to standard logic components). The at least one inlet chamber 132, the at least one outlet chamber 134, and the at least one fluid channel 136 may each be formed by any appropriate process, including, but not limited to, lithography, micromachining, and the like.

Figure 4:
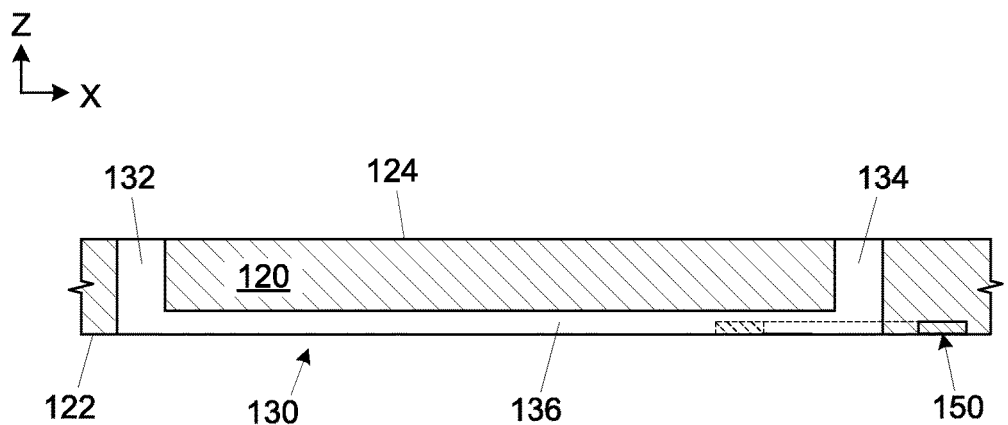
FIGS. 4 and 5, are a side cross-sectional view and a top plan view, respectively, of the base substrate of FIGS. 2 and 3 with an optical waveguide network formed therein, according to another embodiment of the present description.
Figure 5:
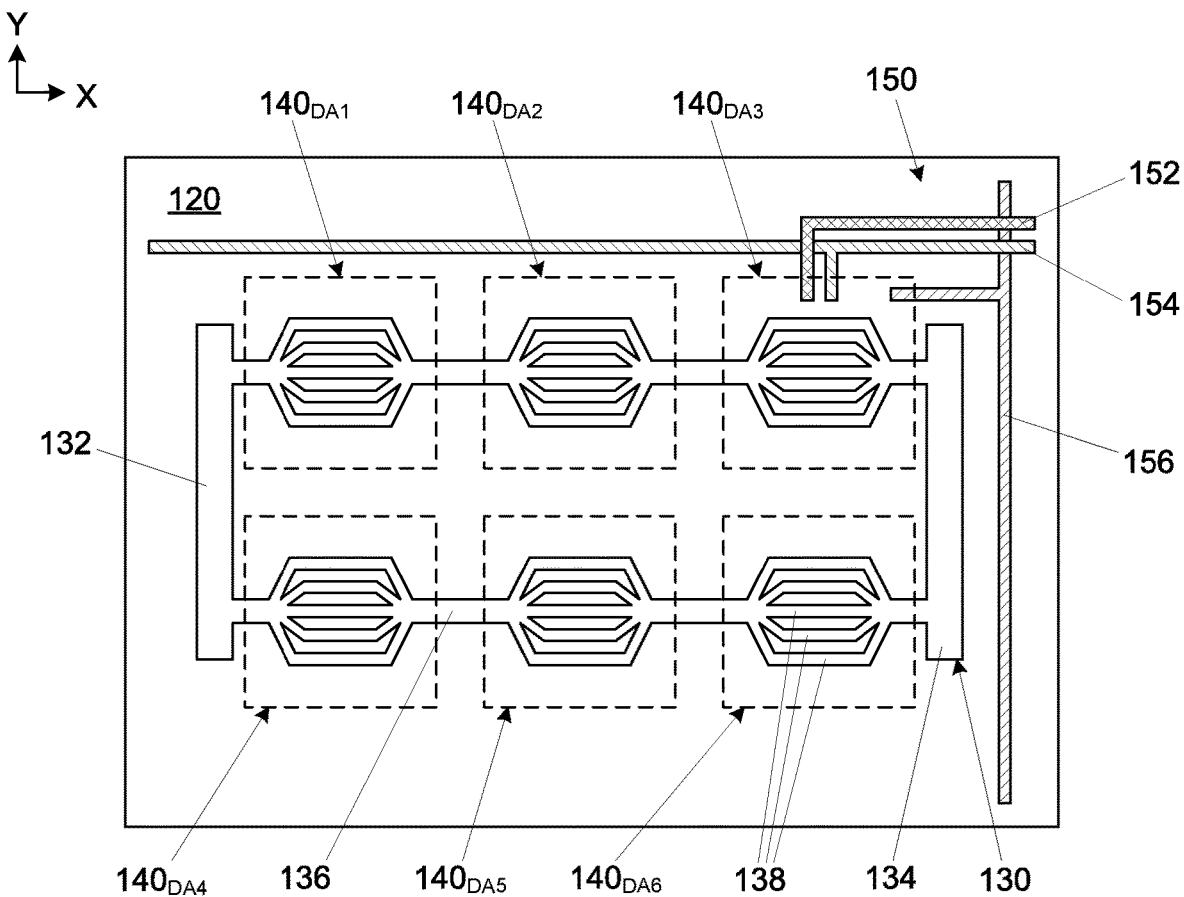

As shown in FIGS. 4 and 5, the optical waveguide network 150 may be formed extending into the first substrate 120 from the first surface 122 thereof. As shown in FIG. 5, the optical waveguide network 150 may include at least one optical carrier distribution network 152, at least one horizontal (x-direction) optical interconnect 154, and at least one vertical (y-direction) optical interconnect 156. The optical waveguide network 150 may be formed by any technique known in the art. For example, any of the components of the optical waveguide network 150 may be formed by depositing or growing a thin oxide layer (not shown) on the base substrate 120, depositing a silicon layer (not shown) on top of the thin oxide layer (not shown) (e.g. by bonding to another wafer or by depositing polycrystalline silicon layer), and etching the silicon layer (not shown) through a mask (not shown) to form the optical waveguide network 150. It is understood, that this technique is merely exemplary, as there are a variety of techniques known in the art. As the various techniques of fabricating waveguides are well known, they will not be discussed herein for purposes of clarity and conciseness. It is noted that the components of the optical waveguide network 150, e.g., at least one optical carrier distribution network 152, at least one horizontal optical interconnect 154, and at least one vertical optical interconnect 156, may cross over one another, which may be achieved by a multi-layer waveguide process, by attaching a cross-over optical chiplet at the transitions, or as a planar waveguide cross-over design (e.g. an optical coupler), as known in the art. It is noted that the optical waveguide network 150 must be formed/routed to avoid areas already occupied by the fluid cooling network 130. It is further noted that the optical waveguide network 150 will have additional components, such as optical to electrical converter; however, as such components are well known and as the incorporation of the optical waveguide network 150 into an electrical system is well known, the components and the explanation of the incorporation will not be shown or discussed herein for purposes of clarity and conciseness.

Figure 6:
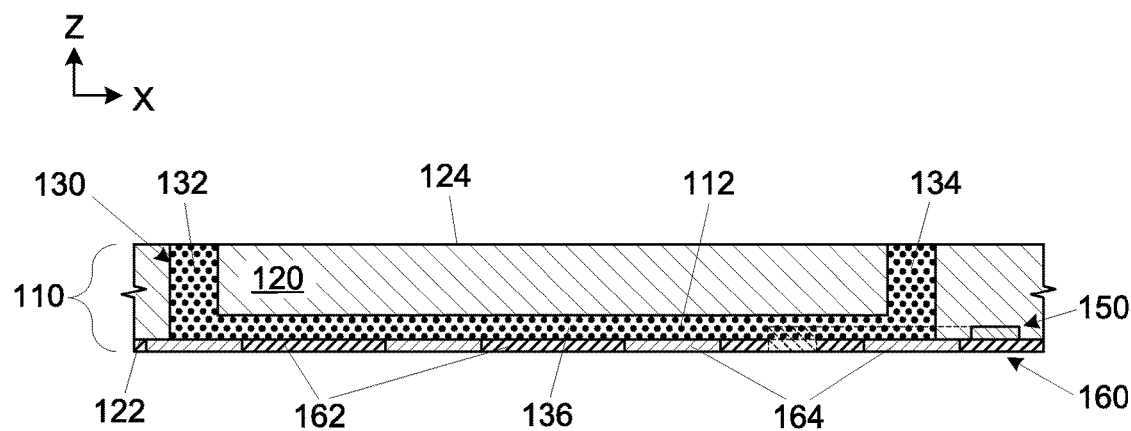
FIGS. 6 and 7 are a side cross-sectional view and a top plan view, respectively, of the base substrate of FIGS. 4 and 5 with at least one electrical interconnect formed therein, according to one embodiment of the present description.
Figure 7:
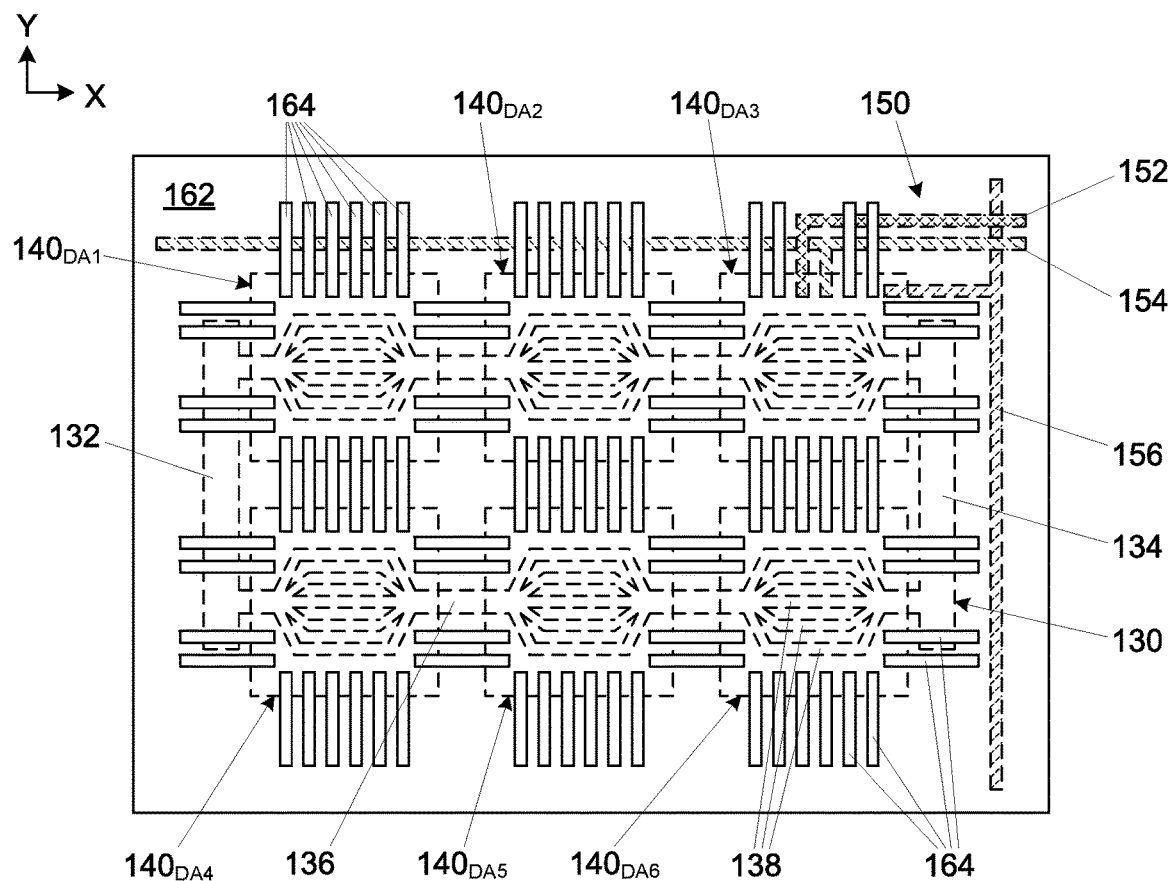

As shown in FIGS. 6 and 7, the base substrate 110 may further include the electrical interconnect layer 160 formed on the first surface 122 of the first substrate 120. In one embodiment, the electrical interconnect layer 160 may be formed by first filling the fluid cooling network 130 with a sacrificial material 112, forming a dielectric material layer 162 over the first surface 122 of the first substrate 120, and forming a plurality of electrical interconnects or traces 164, which may be utilized to interconnect adjacent integrated circuit devices $140_1$-$140_6$ within the integrated circuit device assembly 100 (see FIG. 1) and/or to interconnect integrated circuit devices $140_1$-$140_6$ with electronic devices (not shown) external to the integrated circuit device assembly 100 (see FIG. 1), as will be discussed. In another embodiment, the electrical interconnect layer 160 may also be fabricated separately, then bonded to the first substrate 120.

The dielectric material layer 162 may comprise one or more dielectric material layers, which may be composed of an appropriate dielectric material, including, but not limited to, silicon oxide, silicon nitride, carbon doped dielectrics, fluorine doped dielectrics, porous dielectrics, organic polymeric dielectrics, and the like. The plurality of electrical interconnects or traces 164 may be made of any appropriate conductive material, including but not limited to, metals, such as copper, silver, nickel, gold, and aluminum, alloys thereof, and the like.

Figure 8:
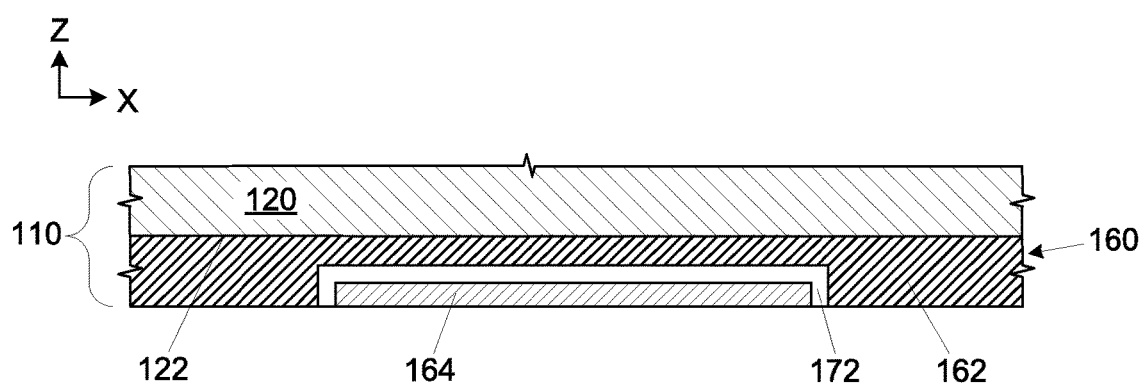
FIG. 8 is a side cross-sectional view of the base substrate of FIGS. 4 and 5 with at least one electrical interconnect formed therein, according to another embodiment of the present description.
Figure 9:
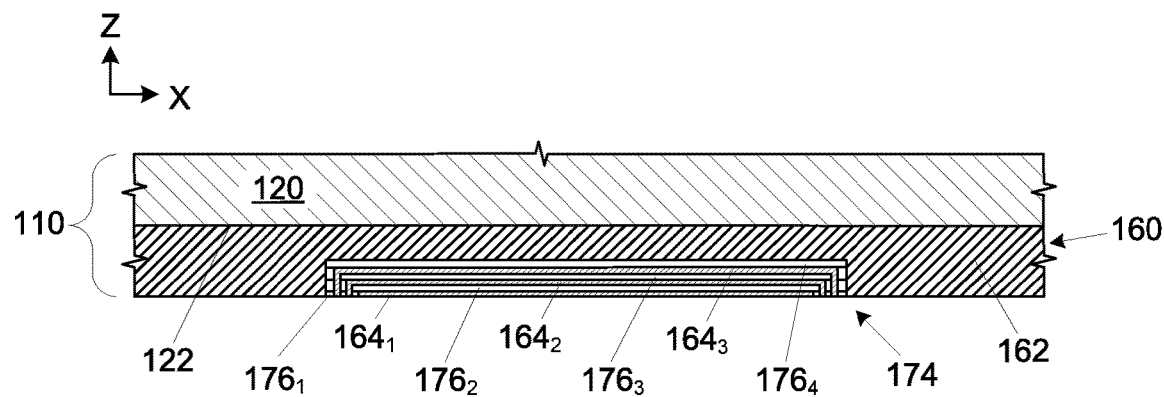
FIG. 9 is a side cross-sectional view of the base substrate of FIGS. 4 and 5 with at least one electrical interconnect formed therein, according to still another embodiment of the present description.

Although the electrical interconnects 164 are shown as individual structures in FIGS. 6 and 7, the embodiments of the present description are not so limited. In one embodiment, as shown in FIG. 8, the electrical interconnects 164 may be formed in a bridge structure 172 (such as silicon bridge) and attached to the first substrate 120. In another embodiment, as shown in FIG. 9, the electrical interconnects 164 may be formed in a layered structure 174, wherein a plurality of electrical interconnects $164_1$-$164_3$ may be formed between and/or through dielectric layers $176_1$-$176_4$.

Figure 10:
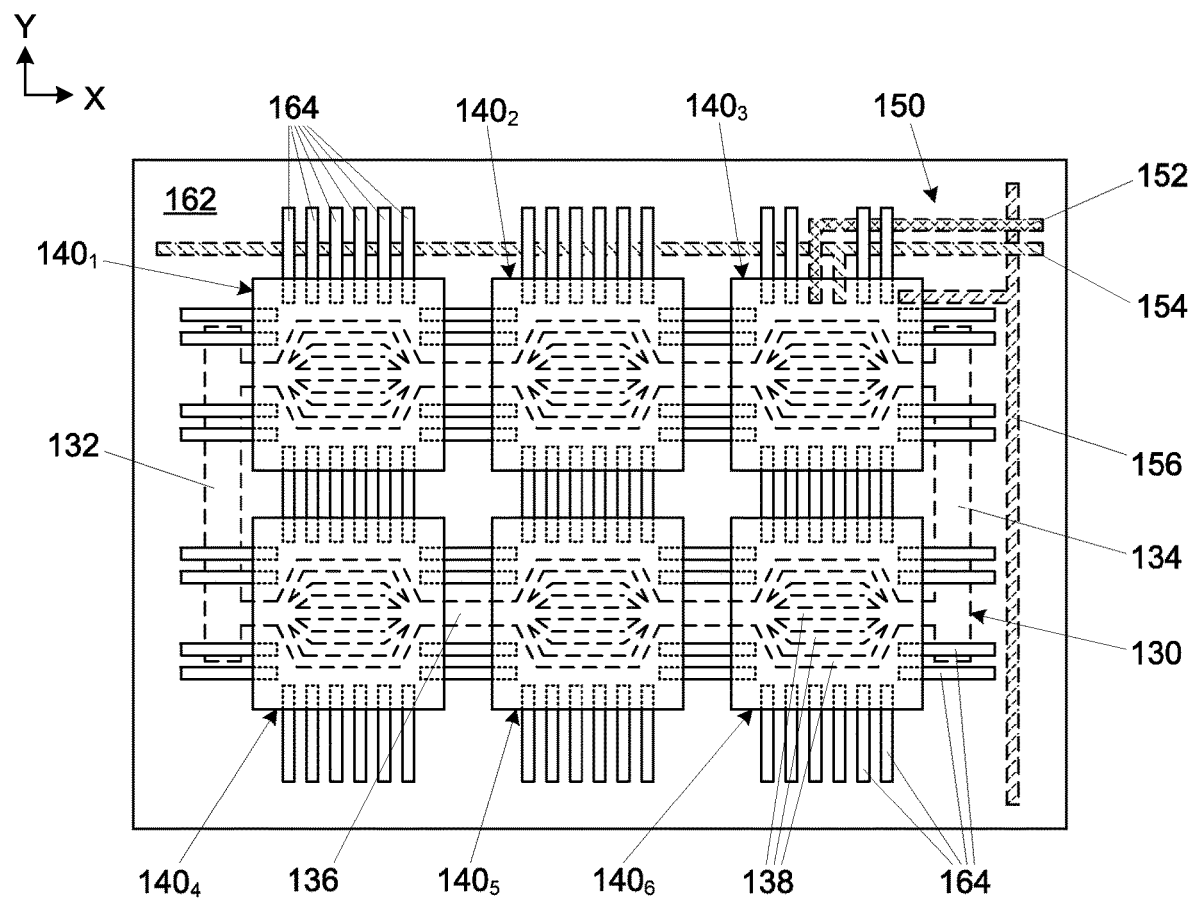
FIGS. 10 and 11 are a side cross-sectional view and a top plan view, respectively, of the base substrate of FIGS. 6 and 7 with a plurality of integrated circuit device attached thereto, according to an embodiment of the present description.

The integrated circuit devices $140_1$-$140_6$ may then be aligned and attached to the base substrate 110, as shown in FIG. 10. At least one of the integrated circuit devices, specifically illustrated as integrated circuit device $140_3$, may be an optical router. As shown in FIGS. 4 and 6, the components of the optical waveguide network 150 (e.g. the at least one optical carrier distribution network 152, the at least one horizontal optical interconnect 154, and the at least one vertical optical interconnect 156) may extend into the device attachment area $140_{DA3}$. Thus, when the optical router (integrated circuit device $140_3$) is attached to the base substrate 110, it will need to be aligned to both a portion of the plurality of electrical interconnects 164 and will need to be aligned to the components of the optical waveguide network 150, e.g., at least one optical carrier distribution network 152, at least one horizontal optical interconnect 154, and at least one vertical optical interconnect 156. This may require using a different mask set/lithography and may require using a larger pitch for the components of the optical waveguide network 150, e.g., at least one optical carrier distribution network 152, at least one horizontal optical interconnect 154, and at least one vertical optical interconnect 156, to insure proper alignment, as will be understood to those skilled in the art. The remainder of the integrated circuit devices, i.e. elements $140_1$, $140_2$, and $140_4$-$140_6$, may be any appropriate devices, including, but not limited to, microprocessors, voltage regulators, multichip packages, chipsets, graphics devices, wireless devices, memory or cache devices (e.g. dynamic random access memory, static random access memory, non-volatile memory, and the like), application specific integrated circuit devices, combinations thereof, stacks thereof, or the like. The memory or cache devices may consist of its own core complex and may require special cooling, as will be understood to those skilled in the art. The remainder of integrated circuit devices, i.e. elements $140_1$, $140_2$, and $140_4$-$140_6$, may be homogeneous (i.e. all the same) or heterogeneous (i.e. at least one different from the others).

Figure 11:
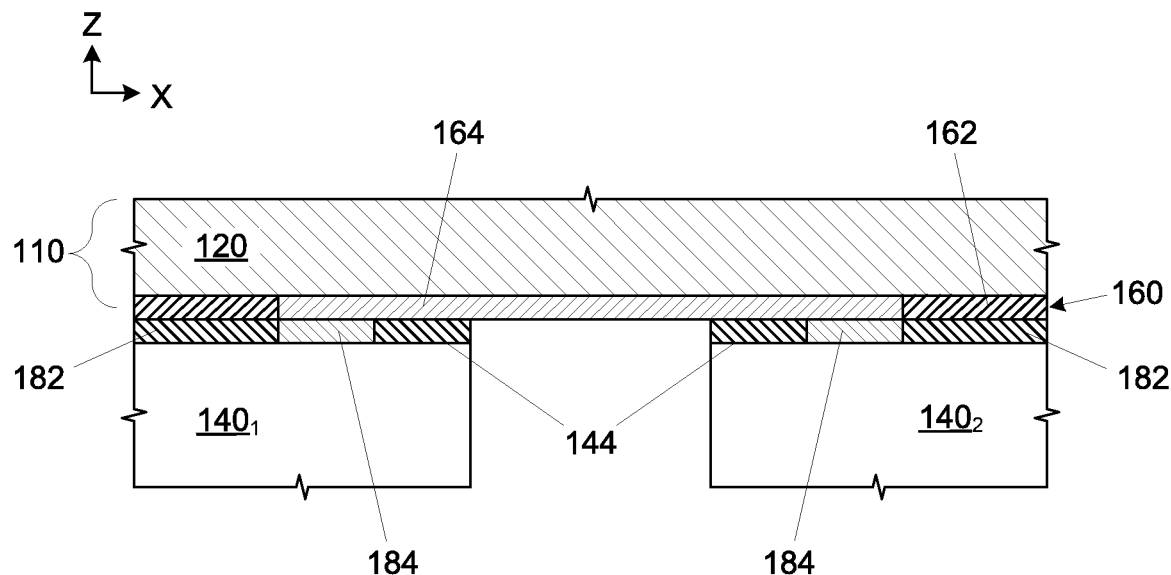

The integrated circuit devices $140_1$-$140_6$ may be electrically attached to the electrical interconnects 164 of the base substrate 110 by any technique known in the art. In one embodiment, a hybrid bonding technique may be used to form the electrical connection. With the hybrid bonding technique, as shown in FIG. 11, the dielectric material layer 162 of the electrical interconnect layer 160 of the base substrate 110 forms a chemical bond (such as a covalent bond) with a dielectric material 182 on the second surface 144 of each of the integrated circuit devices (shown as elements $140_1$ and $140_2$) at room temperature (e.g. about 25 degrees Celsius). Each of the integrated circuit devices (shown as elements $140_1$ and $140_2$) may have at least one bond pad 184 within the dielectric material layer 182. Heat is then applied which forms a stronger bond between the dielectric material layer 162 of the interconnect layer 160 of the base substrate 110 and the dielectric material 182 on the second surface 144 of each of the integrated circuit devices (shown as elements $140_1$ and $140_2$). The heat also simultaneously results in the electrical interconnects 164 of the base substrate 110 and the bond pads 184 of the integrated circuit devices expanding and fusing to form a permanent bond. It is understood that the bond pads 184 are electrically coupled to the integrated circuits (not shown) of their respective integrated circuit devices $140_1$, $140_2$, such as with a through silicon via (not shown) or through a metallization stack (not shown) on the integrated circuit devices (shown as elements $140_1$ and $140_2$). This hybrid bonding technique may hermetically seal the at least one fluid channel 136 of the fluid cooling network 130, and may result in low thermal resistance between the integrated circuit device $140_1$-$140_6$ and the at least one fluid channel 136.

Figure 12:
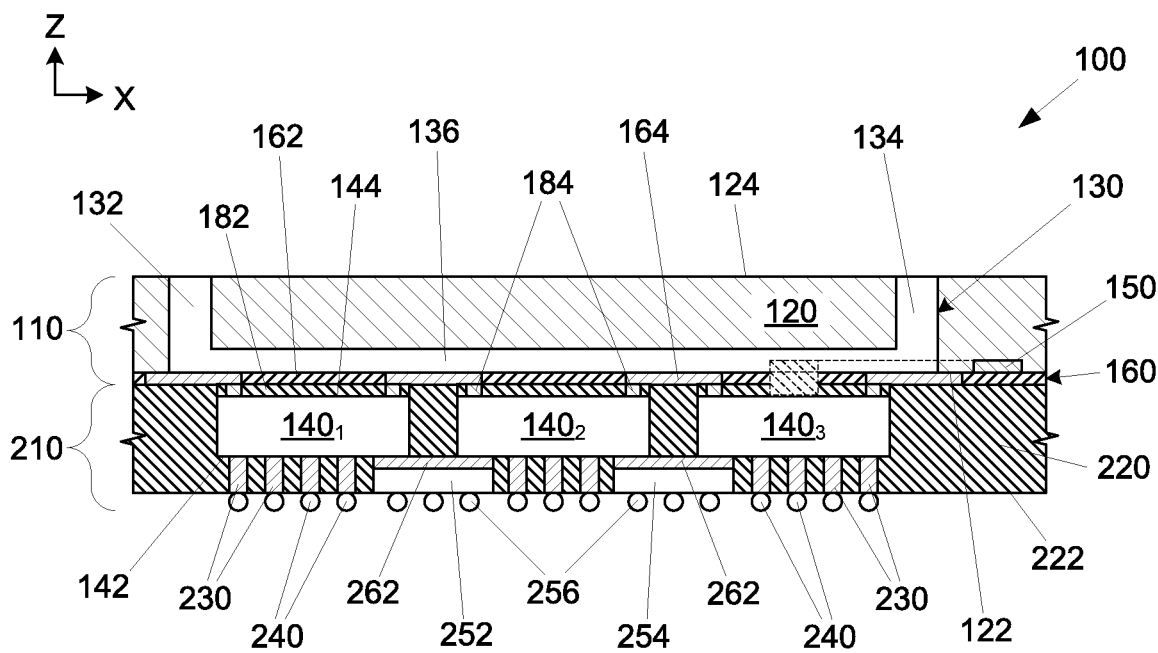
FIG. 12 is a side cross-sectional view of the formation of the reconstituted wafer on the base substrate of FIGS. 10 and 11, according to an embodiment of the present description.

As shown in FIG. 12, the integrated circuit devices (elements $140_1$-$140_3$ are illustrated) may be used to form the reconstituted wafer 210 by encapsulating them in the dielectric material 220. In one embodiment, the sacrificial material 112 may be removed after the deposition of the dielectric material 220. The reconstituted wafer 210 includes the plurality of conductive vias 230 extending from the first surface 142 of each of the integrated circuit devices $140_1$-$140_3$ to a first surface 222 of the dielectric material 220. As will be understood to those skilled in the art, the conductive vias 230 may be in electrical communication with integrated circuitry (not shown) within the integrated circuit devices, e.g. elements $140_1$-$140_3$. The dielectric material 220 may be an epoxy that may be filled with inorganic fillers, such as silica, or may be an inorganic material, such as silicon oxide or silicon nitride.

As further shown in FIG. 12, the external attachment 240, such as a solder ball, may be disposed on each of the conductive vias 230 for the attachment of the integrated circuit device assembly 100 to external components (not shown), such as an interposer, a printed circuit board, a motherboard, or the like. Although the external attachments 240 are shown as solder balls for a ball grid array attachment, the external attachments 240 may be conductive pillars for land grid array attachment or may be conductive pins for a socketed attachment.

The reconstituted wafer 210 may further include at least one chiplet between and electrically coupled to a pair of adjacent integrated circuit devices. For example, as previously discussed with regard to FIG. 1 and as also shown in FIG. 12, the first chiplet 252 may be shared with adjacent integrated circuit devices $140_1$ and $140_2$, and the second chiplet 254 may be shared with adjacent integrated circuit devices $140_2$ and $140_3$. The at least one chiplet, e.g. the first chiplet 252 and the second chiplet 254, may be active and/or passive devices, and may have external attachments 256, such as solder balls, for attachment to a motherboard (not shown). Although the external attachments 256 are shown as solder balls for a ball grid array attachment, the external attachments 256 may be conductive pillars for land grid array attachment or may be conductive pins for socketed attachment. In a passive aspect of the devices may be traces, routes, or interconnects 262 and the active aspect of the devices may be functional integrated circuitry, including, but not limited to, local memory cache and active routing (such as "through bus-bars") to reduce signal congestion, for power delivery to the integrated circuit devices $140_1$-$140_6$ through a DC-DC converter, and the like. It is understood that the reconstituted wafer 210 can be formed first, then attached to the base substrate 110 through the electrical interconnect layer 160 thereof.

Figure 13:
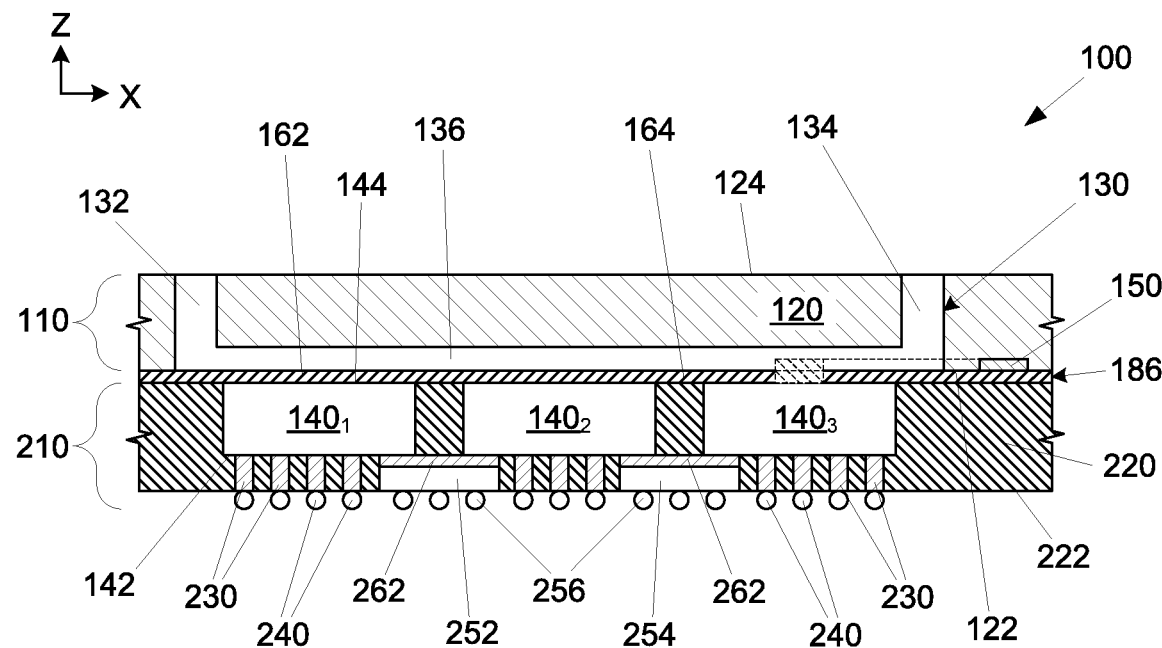
FIG. 13 is a side cross-sectional view of the attachment of the reconstituted wafer on the base substrate, according to one embodiment of the present description.

In one embodiment, the at least one chiplet, e.g. the first chiplet 252 and the second chiplet 254, may be routing/interconnect devices, which may make the interconnect layer 160 unnecessary. As shown in FIG. 13, the reconstituted wafer 210 may be attached to or formed on the base substrate 110 with an adhesive or sealing layer 186 therebetween.

Figure 14:
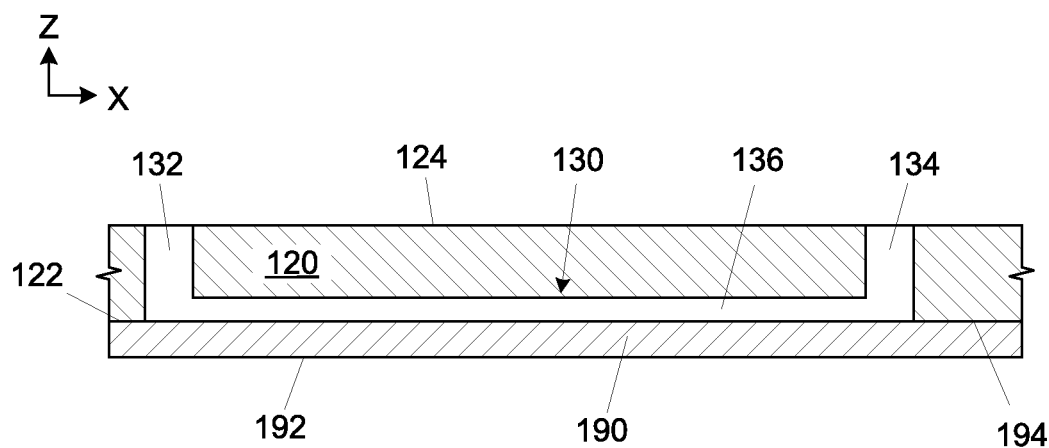
FIGS. 14-16 is a side cross-sectional views of the fabrication of the base substrate with a first and second substrate, according to an embodiment of the present description.
Figure 15:
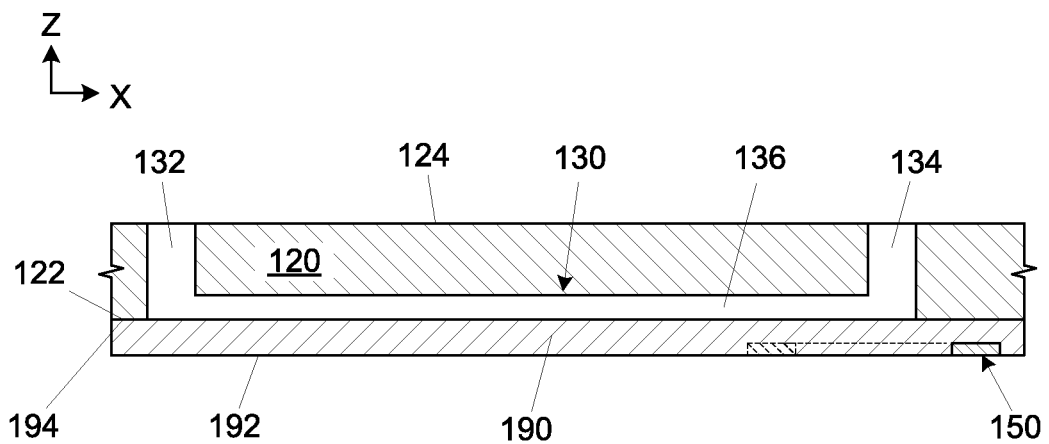
Figure 16:
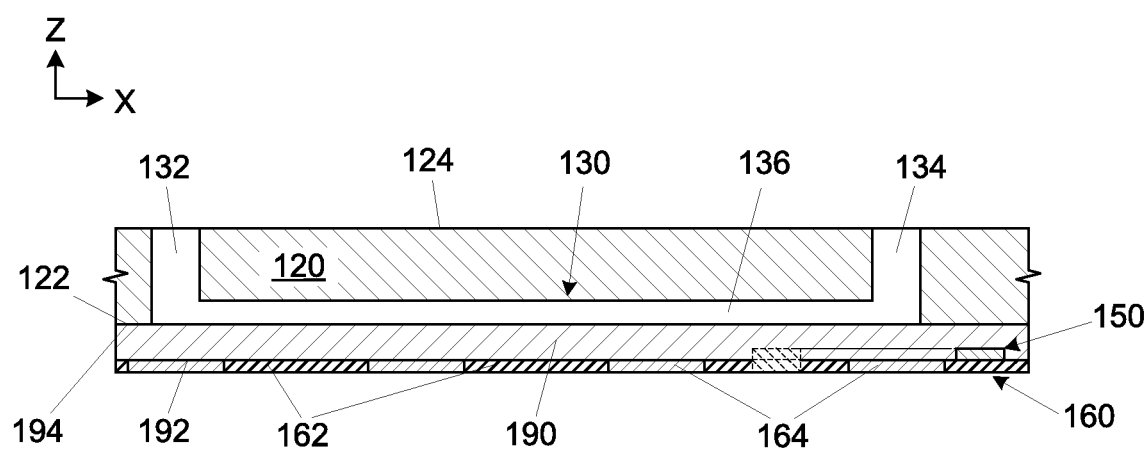

In another embodiment of the present description, when space is at a premium, the optical waveguide network 150 may be moved to be vertically (y-direction) aligned with the fluid cooling network 130. This may be achieved with a second substrate 190, such as a silicon substrate, which will eliminate the need to use the sacrificial material 112, as discussed with regard to FIGS. 6 and 7. Beginning with FIGS. 2 and 3, the second substrate 190, having a first surface 192 and an opposing second surface 194, may be provided or formed, and the second surface 194 of the second substrate 190 may be attached, such as with an adhesive (not shown) to the first surface 122 of the first substrate 120, thereby sealing the at least one fluid channel 136, as shown in FIG. 14. The optical waveguide network 150 may then be formed to extend into the second substrate 190 from the first surface 192 thereof. As previously discussed, and as shown in FIG. 15, the optical waveguide network 150 may include the at least one optical carrier distribution network 152, the at least one horizontal optical interconnect 154, and the at least one vertical optical interconnect 156. The optical waveguide network 130 may be formed by any technique known in the art, as previously discussed. As shown in FIG. 16, the electrical interconnect layer 150 may be formed on the first surface 192 of the second substrate 190, and the fabrication of the integrated circuit device assembly 100 may continue in the manner similar to that described beginning at FIG. 10 and continuing therefrom.

Figure 17:
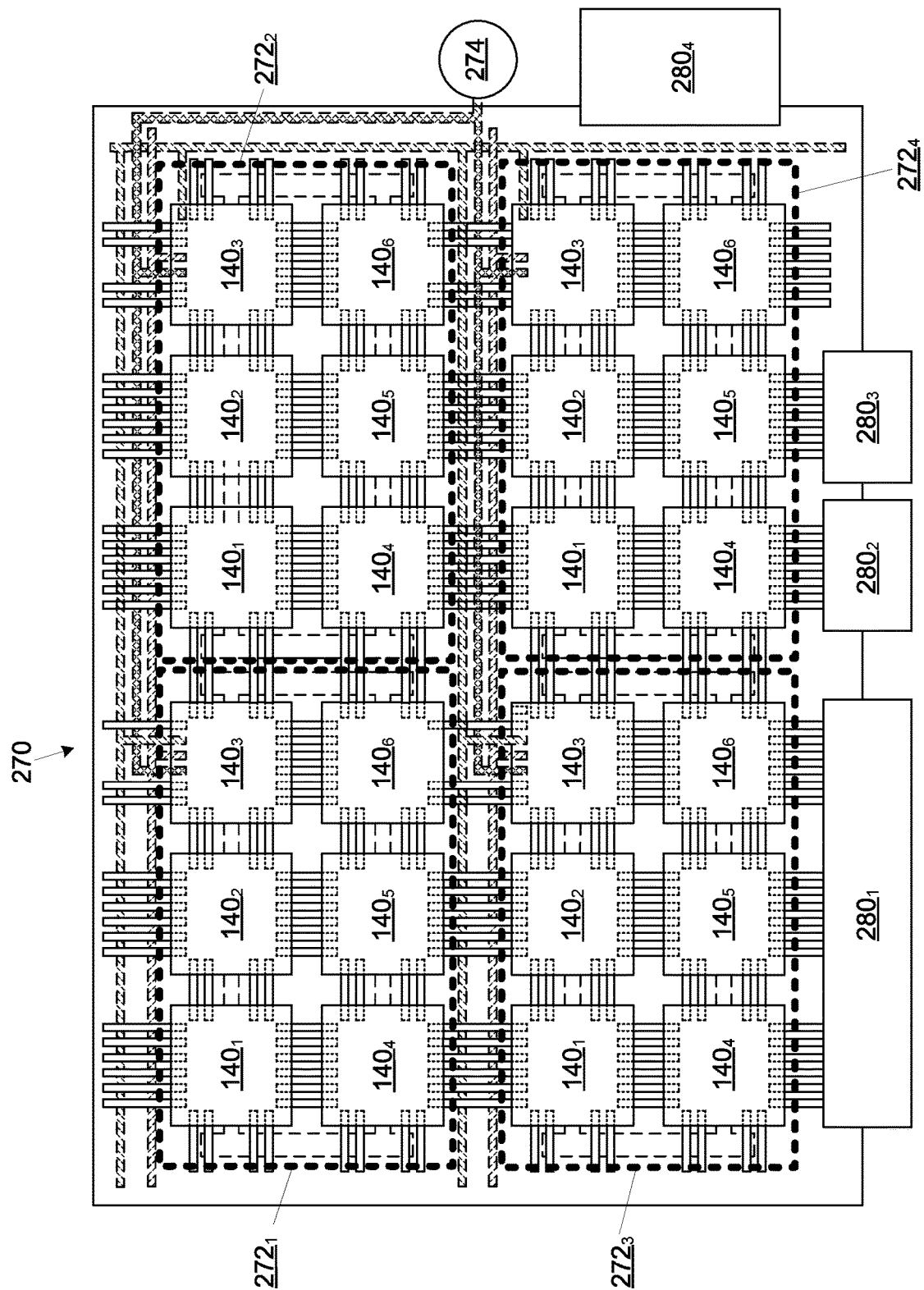
FIG. 17 are a top plan view of a large integrated circuit device assembly, according to one embodiment of the present description.

In still a further embodiment of the present invention, the configuration of integrated circuit device $140_1$-$140_4$ may be a "set" or "tile" in a large integrated circuit device assembly 270. As shown in FIG. 17, four tiles $272_1$-$272_4$ (identified with dotted lines) may be coupled together to form the large integrated circuit device assembly 270. As shown, a single laser diode 274 may be used for the optical carrier distribution network 152 (see FIG. 10), which is shared between each of the four tiles $272_1$-$272_4$. However, multiple laser diodes 274 and/or multiple optical carrier distribution networks 152 (see FIG. 10), may be used for redundancy/power. As previously discussed, the integrated circuit devices $140_1$-$140_6$ of the tiles $272_1$-$272_4$ may communicate to nearby integrated circuit devices through the electrical interconnect 164 (see FIG. 10) or may choose to use the optical waveguide network 150 (see FIG. 10) to communicate with more distant integrated circuit devices. Thus, the embodiments of the present description support a systolic data path (i.e. linear through the integrated circuit devices from one side of the integrated circuit device assembly 270 to another), as well as branching (e.g. though the electrical interconnects 164 and the optical waveguide network 150 (see FIG. 10)). Because of the capabilities of the embodiment of the present description, additional off-assembly device components $280_1$-$280_4$, such as memory controller, peripheral component interconnect express (PCIe) interface, accelerator links, and the like, may be coupled to the large integrated device assembly 270, such as about a periphery of at least one of the tiles $272_1$-$272_4$, as shown in FIG. 17. These off-assembly device components $280_1$-$280_6$, may have at least one optical router (not shown) associated therewith to minimize the latency to and/or from any single integrated circuit device $140_1$-$140_6$ of the tiles $272_1$-$272_4$.

Figure 18:
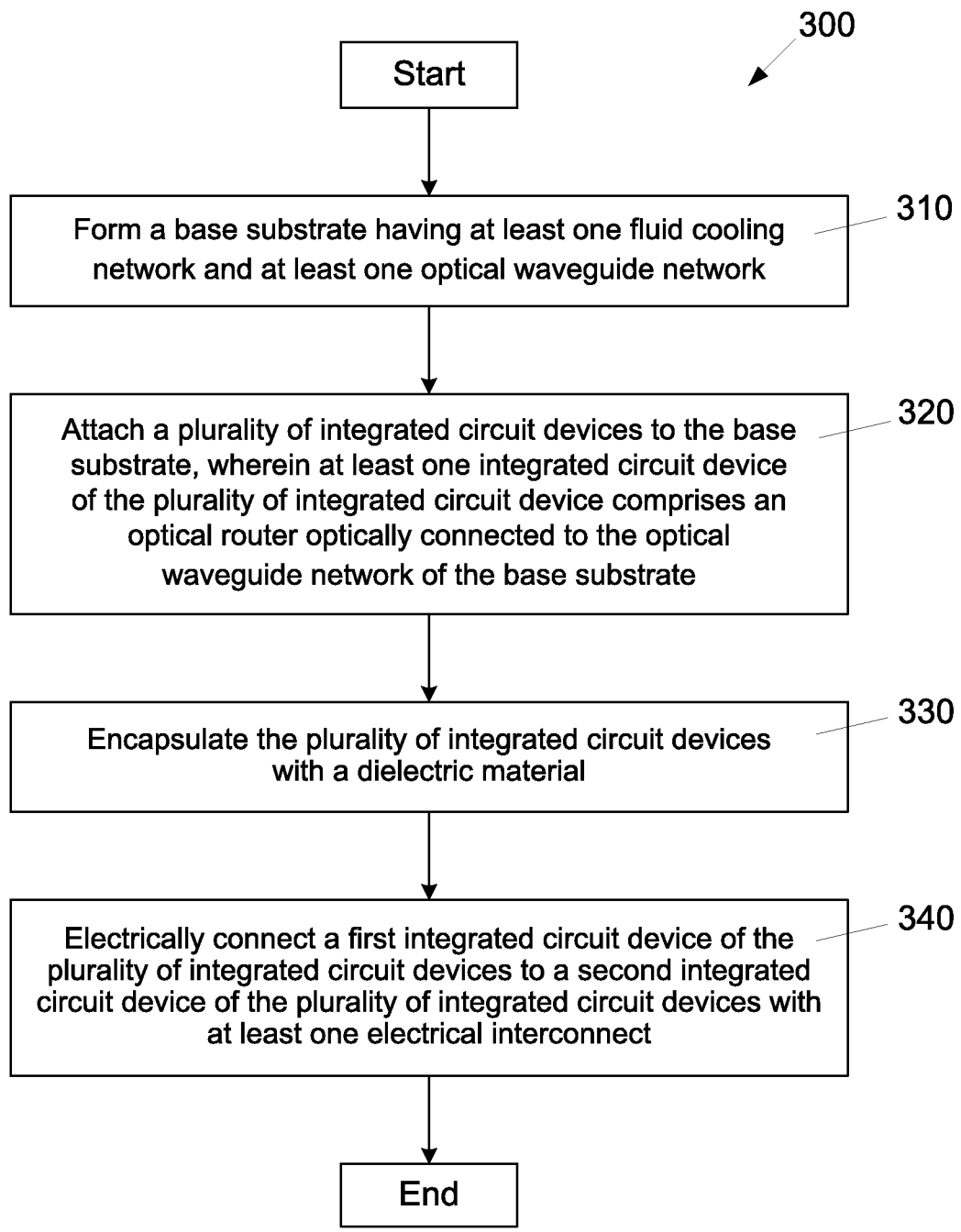
FIG. 18 is a flow diagram of a method for fabricating an integrated circuit device assembly, according to an embodiment of the present description.

FIG. 18 is a flow chart of a process 300 of fabricating an integrated circuit device assembly according to an embodiment of the present description. As set forth in block 310, a base substrate having at least one fluid cooling network and at least one optical waveguide network may be formed. A plurality of integrated circuit devices may be attached to the base substrate, wherein at least one integrated circuit device of the plurality of integrated circuit device comprises an optical router optically coupled to the optical waveguide network of the base substrate, as set forth in block 320. As set forth in block 330, the plurality of integrated circuit devices may be encapsulated with a dielectric material. A first integrated circuit device of the plurality of integrated circuit devices may be electrically coupled to a second integrated circuit device of the plurality of integrated circuit devices with at least one electrical interconnect, as set forth in block 340.

Figure 19:
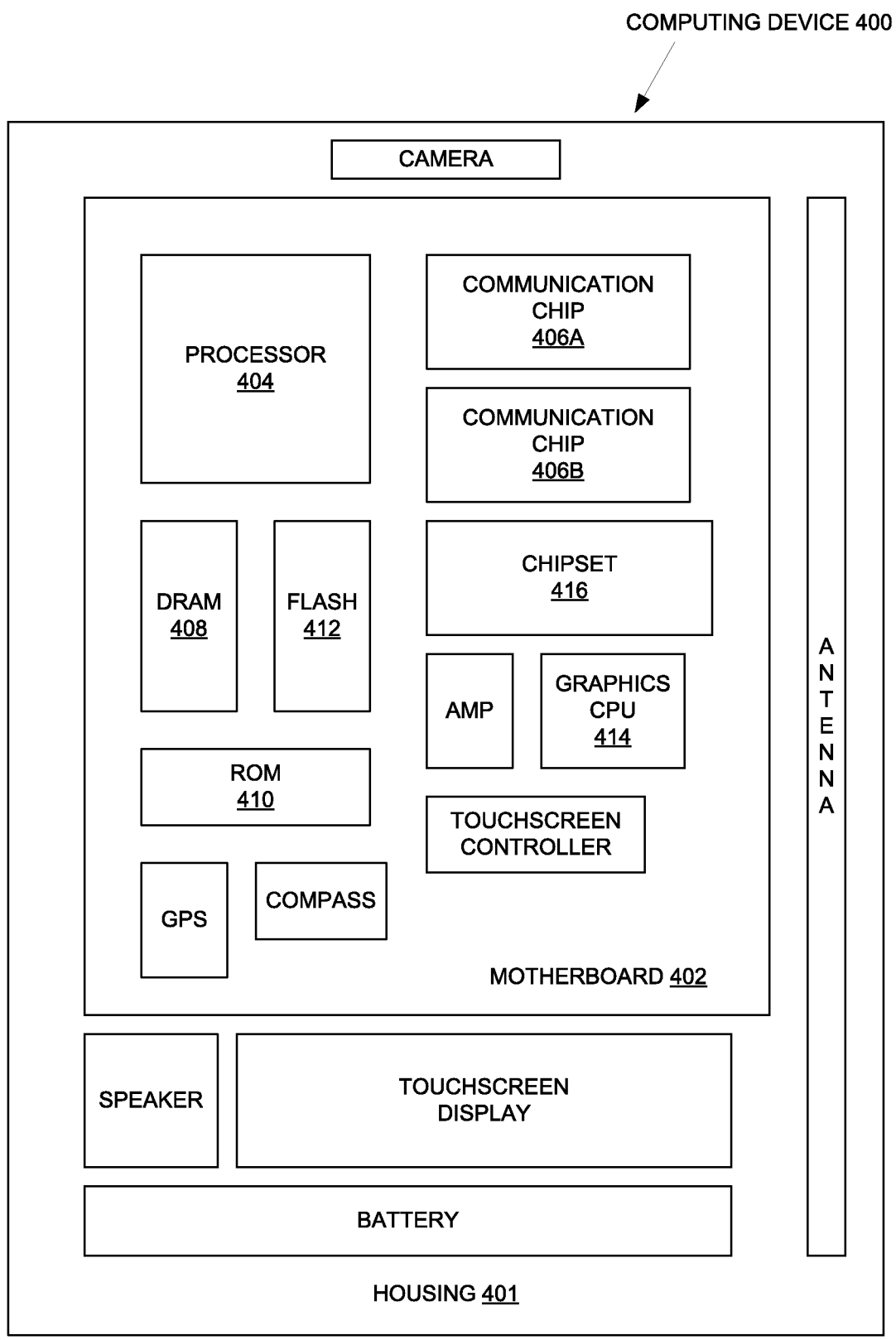
FIG. 19 is an electronic device/system, according to an embodiment of the present description.

FIG. 19 illustrates an electronic system or computing device 400 in accordance with one implementation of the present description. The computing device 400 may include a housing 401 having a board 402 disposed therein. The computing device 400 may include a number of integrated circuit components, including but not limited to a processor 404, at least one communication chip 406A, 406B, volatile memory 408 (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 402. In some implementations, at least one of the integrated circuit components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip or device may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include at least one integrated circuit device assembly comprising a base substrate having at least one fluid cooling network and at least one optical waveguide network, a plurality of integrated circuit devices attached to the base substrate, wherein at least one integrated circuit device of the plurality of integrated circuit device comprises an optical router optically coupled to the at least one optical waveguide network of the base substrate, a dielectric material encapsulating the plurality of integrated circuit devices, and at least one interconnect electrically coupling a first integrated circuit device of the plurality of integrated circuit devices to a second integrated circuit device of the plurality of integrated circuit devices.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-19. The subject matter may be applied to other integrated circuit devices and assembly applications, as well as any appropriate electronic application, as will be understood to those skilled in the art.

The follow examples pertain to further embodiments and specifics in the examples may be used anywhere in one or more embodiments, wherein Example 1 is an integrated circuit device assembly, comprising a base substrate having at least one fluid cooling network and at least one optical waveguide network, a plurality of integrated circuit devices attached to the base substrate, wherein at least one integrated circuit device of the plurality of integrated circuit device comprises an optical router optically coupled to the at least one optical waveguide network of the base substrate, a dielectric material encapsulating the plurality of integrated circuit devices, and at least one electrical interconnect electrically coupling a first integrated circuit device of the plurality of integrated circuit devices to a second integrated circuit device of the plurality of integrated circuit devices.

In Example 2, the subject matter of Example 1 can optionally include an electrical interconnect layer between the base substrate and the plurality of integrated circuit devices and wherein the at least one electrical interconnect is disposed within the electrical interconnection layer.

In Example 3, the subject matter of any of Examples 1 and 2 can optionally include the dielectric material being selected from the group consisting of a polymer material, an inorganic material, and a mixture of a polymer material and inorganic filler particles.

In Example 4, the subject matter of any of Examples 1 to 3 can optionally include the at least one optical waveguide network comprising at least one optical carrier distribution network, at least one horizontal optical interconnect, and at least one vertical optical interconnect.

In Example 5, the subject matter of any of Examples 1 to 4 can optionally include the base substrate comprises a first substrate and wherein the at least one fluid cooling network channel comprises at least one inlet chamber, at least one outlet chamber, and at least one fluid channel extending into the first substrate from a first surface thereof, wherein the at least one fluid channel extends between the inlet chamber and the outlet chamber.

In Example 6, the subject matter of Example 5 can optionally include the at least one optical waveguide network extending into the first substrate from the first surface thereof.

In Example 7, the subject matter of Example 5 can optionally include the base substrate further comprising a second substrate having a first surface and an opposing second surface, wherein the second surface of the second substrate is attached to the first surface of the first substrate, and wherein the at least one optical waveguide network extends into the second substrate from the first surface thereof.

In Example 8, the subject matter of any of Examples 1 to 7 can optionally include a second surface of each of the plurality of integrated circuit devices being attached to the base substrate, and further including at least one chiplet electrically coupling a first surface of the first integrated circuit device of the plurality of integrated circuit devices to a first surface of the second integrated circuit device of the plurality of integrated circuit devices.

In Example 9, the subject matter of Example 8 can optionally include the at least one chiplet being a passive device.

In Example 10, the subject matter of Example 8 can optionally include the at least one chiplet being an active device.

Example 11 is an electronic system, comprising a board and an integrated circuit device assembly electrically attached to the board, wherein the integrated circuit device assembly comprises an integrated circuit device assembly, comprising a base substrate having at least one fluid cooling network and at least one optical waveguide network, a plurality of integrated circuit devices attached to the base substrate, wherein at least one integrated circuit device of the plurality of integrated circuit device comprises an optical router optically coupled to the at least one optical waveguide network of the base substrate, a dielectric material encapsulating the plurality of integrated circuit devices, and at least one electrical interconnect electrically couping a first integrated circuit device of the plurality of integrated circuit devices to a second integrated circuit device of the plurality of integrated circuit devices.

In Example 12, the subject matter of Example 11 can optionally include an electrical interconnect layer between the base substrate and the plurality of integrated circuit devices and wherein the at least one electrical interconnect is disposed within the electrical interconnection layer.

In Example 13, the subject matter of any of Examples 11 and 12 can optionally include the dielectric material being selected from the group consisting of a polymer material, an inorganic material, and a mixture of a polymer material and inorganic filler particles.

In Example 14, the subject matter of any of Examples 11 to 13 can optionally include the at least one optical waveguide network comprising at least one optical carrier distribution network, at least one horizontal optical interconnect, and at least one vertical optical interconnect.

In Example 15, the subject matter of any of Examples 11 to 14 can optionally include the base substrate comprises a first substrate and wherein the at least one fluid cooling network channel comprises at least one inlet chamber, at least one outlet chamber, and at least one fluid channel extending into the first substrate from a first surface thereof, wherein the at least one fluid channel extends between the inlet chamber and the outlet chamber.

In Example 16, the subject matter of Example 15 can optionally include the at least one optical waveguide network extending into the first substrate from the first surface thereof.

In Example 17, the subject matter of Example 15 can optionally include the base substrate further comprising a second substrate having a first surface and an opposing second surface, wherein the second surface of the second substrate is attached to the first surface of the first substrate, and wherein the at least one optical waveguide network extends into the second substrate from the first surface thereof.

In Example 18, the subject matter of any of Examples 11 to 17 can optionally include a second surface of each of the plurality of integrated circuit devices being attached to the base substrate, and further including at least one chiplet electrically coupling a first surface of the first integrated circuit device of the plurality of integrated circuit devices to a first surface of the second integrated circuit device of the plurality of integrated circuit devices.

In Example 19, the subject matter of Example 18 can optionally include the at least one chiplet being a passive device.

In Example 20, the subject matter of Example 18 can optionally include the at least one chiplet being an active device.

Example 21 is a method of fabricating an integrated circuit device assembly comprising forming a base substrate having at least one fluid cooling network and at least one optical waveguide network, attaching a plurality of integrated circuit devices to the base substrate, wherein at least one integrated circuit device of the plurality of integrated circuit device comprises an optical router optically coupled to the at least one optical waveguide network of the base substrate, encapsulating the plurality of integrated circuit devices with a dielectric material, and electrically coupling a first integrated circuit device of the plurality of integrated circuit devices to a second integrated circuit device of the plurality of integrated circuit devices with at least one electrical interconnect.

In Example 22, the subject matter of Example 21 can optionally include forming an electrical interconnect layer between the base substrate and the plurality of integrated circuit devices and wherein the at least one electrical interconnect is disposed within the electrical interconnection layer.

In Example 23, the subject matter of any of Examples 21 and 22 can optionally include wherein encapsulating the plurality of integrated circuit devices with the dielectric material comprises encapsulating the plurality of integrate circuit devices with a material selected from the group consisting of a polymer material, an inorganic material, and a mixture of a polymer material and inorganic filler particles.

In Example 24, the subject matter of any of Examples 21 to 23 can optionally include the at least one optical waveguide network comprising forming at least one optical carrier distribution network, forming at least one horizontal optical interconnect, and forming at least one vertical optical interconnect.

In Example 25, the subject matter of any of Examples 21 to 24 can optionally include the base substrate comprises a first substrate and wherein the at least one fluid cooling network channel comprises at least one inlet chamber, at least one outlet chamber, and at least one fluid channel extending into the first substrate from a first surface thereof, wherein the at least one fluid channel extends between the inlet chamber and the outlet chamber.

In Example 26, the subject matter of Example 25 can optionally include the at least one optical waveguide network extending into the first substrate from the first surface thereof.

In Example 27, the subject matter of Example 25 can optionally include the base substrate further comprising a second substrate having a first surface and an opposing second surface, wherein the second surface of the second substrate is attached to the first surface of the first substrate, and wherein the at least one optical waveguide network extends into the second substrate from the first surface thereof.

In Example 28, the subject matter of any of Examples 21 to 27 can optionally include attaching the plurality of integrated circuit devices to the base substrate comprising attaching a second surface of each of the plurality of integrated circuit devices being to the base substrate, and further including electrically coupling at least one chiplet to a first surface of the first integrated circuit device of the plurality of integrated circuit devices to a first surface of the second integrated circuit device of the plurality of integrated circuit devices.

In Example 29, the subject matter of Example 28 can optionally include electrically attaching the at least one chiplet comprising electrically attaching a passive device.

In Example 30, the subject matter of Example 28 can optionally include electrically attaching the at least one chiplet comprising electrically attaching an active device.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit device assembly, comprising:
   a base substrate having at least one fluid cooling network and at least one optical waveguide network;
   a plurality of integrated circuit devices attached to the base substrate, wherein at least one integrated circuit device of the plurality of integrated circuit device comprises an optical router optically coupled to the at least one optical waveguide network of the base substrate;
   a dielectric material encapsulating the plurality of integrated circuit devices; and
   at least one electrical interconnect electrically coupling a first integrated circuit device of the plurality of integrated circuit devices to a second integrated circuit device of the plurality of integrated circuit devices; and
   an electrical interconnect layer between the base substrate and the plurality of integrated circuit devices and wherein the at least one electrical interconnect is disposed within the electrical interconnect layer.

2. The integrated circuit device assembly of claim 1, wherein the dielectric material is selected from the group consisting of a polymer material, an inorganic material, and a mixture of a polymer material and inorganic filler particles.

3. The integrated circuit device assembly of claim 1, wherein the at least one optical waveguide network comprises at least one optical carrier distribution network, at least one horizontal optical interconnect, and at least one vertical optical interconnect.

4. The integrated circuit device assembly of claim 1, wherein the base substrate comprises a first substrate and wherein the at least one fluid cooling network channel comprises at least one inlet chamber, at least one outlet chamber, and at least one fluid channel extending into the first substrate from a first surface thereof, wherein the at least one fluid channel extends between the inlet chamber and the outlet chamber.

5. The integrated circuit device assembly of claim 4, wherein the at least one optical waveguide network extends into the first substrate from the first surface thereof.

6. The integrated circuit device assembly of claim 4, wherein the base substrate further comprises a second substrate having a first surface and an opposing second surface, wherein the second surface of the second substrate is attached to the first surface of the first substrate, and wherein the at least one optical waveguide network extends into the second substrate from the first surface thereof.

7. The integrated circuit device assembly of claim 1, wherein a second surface of each of the plurality of integrated circuit devices is attached to the base substrate, and further including at least one chiplet electrically coupling a first surface of the first integrated circuit device of the plurality of integrated circuit devices to a first surface of the second integrated circuit device of the plurality of integrated circuit devices.

8. The integrated circuit device assembly of claim 7, wherein the at least one chiplet is a passive device.

9. The integrated circuit device assembly of claim 7, wherein the at least one chiplet is an active device.

10. An electronic system, comprising:
    a board; and
    an integrated circuit device assembly electrically attached to the board, wherein the integrated circuit device assembly comprises:
    a base substrate having at least one fluid cooling network and at least one optical waveguide network;
    a plurality of integrated circuit devices attached to the base substrate, wherein at least one integrated circuit device of the plurality of integrated circuit device comprises an optical router optically coupled to the at least one optical waveguide network of the base substrate;
    a dielectric material encapsulating the plurality of integrated circuit devices;
    at least one electrical interconnect electrically coupling a first integrated circuit device of the plurality of integrated circuit devices to a second integrated circuit device of the plurality of integrated circuit devices; and
    an electrical interconnect layer between the base substrate and the plurality of integrated circuit devices and wherein the at least one electrical interconnect is disposed within the electrical interconnect layer.

11. The electronic system of claim 10, wherein the dielectric material is selected from the group consisting of a polymer material, an inorganic material, and a mixture of a polymer material and inorganic filler particles.

12. The electronic system of claim 10, wherein the at least one optical waveguide network comprises at least one optical carrier distribution network, at least one horizontal optical interconnect, and at least one vertical optical interconnect.

13. The electronic system of claim 10, wherein the base substrate comprises a first substrate and wherein the at least one fluid cooling network comprises at least one inlet chamber, at least one outlet chamber, and at least one fluid channel extending into the first substrate from a first surface thereof, wherein the at least one fluid channel extends between the inlet chamber and the outlet chamber.

14. The electronic system of claim 13, wherein the at least one optical waveguide network extends into the first substrate from the first surface thereof.

15. The electronic system of claim 13, wherein the base substrate further comprises a second substrate having a first surface and an opposing second surface, wherein the second surface of the second substrate is attached to the first surface of the first substrate, and wherein the at least one optical waveguide network extends into the second substrate from the first surface thereof.

16. The electronic system of claim 10, wherein a second surface of each of the plurality of integrated circuit devices is attached to the base substrate, and further including at least one chiplet electrically coupling a first surface of the first integrated circuit device of the plurality of integrated circuit devices to a first surface of the second integrated circuit device of the plurality of integrated circuit devices.

17. A method of forming an integrated circuit device assembly comprising:
    forming a base substrate including forming at least one fluid cooling network and forming at least one optical waveguide network therein;
    attaching a plurality of integrated circuit devices to the base substrate, wherein at least one integrated circuit device of the plurality of integrated circuit device comprises an optical router optically coupled to the optical waveguide network of the base substrate;
    encapsulating the plurality of integrated circuit devices with a dielectric material;
    electrically coupling a first integrated circuit device of the plurality of integrated circuit devices to a second integrated circuit device of the plurality of integrated circuit devices with at least one electrical interconnect; and
    forming an electrical interconnect layer between the base substrate and the plurality of integrated circuit devices and wherein the at least one electrical interconnect is disposed within the electrical interconnect layer.

18. The method of claim 17, wherein forming the at least one optical waveguide network comprises forming at least one optical carrier distribution network, forming at least one horizontal optical interconnect, and forming at least one vertical optical interconnect.

19. The method of claim 17, wherein forming the base substrate comprises forming a first substrate, wherein forming the at least one fluid cooling network comprises forming at least one inlet chamber, forming at least one outlet chamber, and forming at least one fluid channel extending into the first substrate from a first surface thereof, and wherein the at least one fluid channel is formed to extend between the inlet chamber and the outlet chamber.

20. The method of claim 19, wherein forming the at least one optical waveguide network comprising forming the at least one optical waveguide network to extend into the first substrate from the first surface thereof.

21. The method of claim 19, wherein forming the base substrate further comprises forming a second substrate having a first surface and an opposing second surface, attaching the second surface of the second substrate to the first surface of the first substrate, and wherein forming the at least one optical waveguide network comprised forming the optical waveguide network to extend into the second substrate from the first surface thereof.

22. The method of claim 17, wherein attaching the plurality of integrated circuit devices to the base substrate comprises attaching a second surface of each of the plurality of integrated circuit devices to the base substrate, and further including electrically coupling at least one chiplet to a first surface of the first integrated circuit device of the plurality of integrated circuit devices and to a first surface of the second integrated circuit device of the plurality of integrated circuit devices.

\* \* \* \* \*